United States Patent
Yu

(10) Patent No.: US 6,423,985 B1
(45) Date of Patent: Jul. 23, 2002

(54) SCR COMPACT STRUCTURE

(75) Inventor: Ta-Lee Yu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/365,192

(22) Filed: Aug. 2, 1999

(30) Foreign Application Priority Data

Apr. 14, 1999 (TW) .................................. 88105928 A

(51) Int. Cl.$^7$ .............................................. H01L 29/74
(52) U.S. Cl. ...................................... 257/107; 257/173
(58) Field of Search ............................. 257/107, 110, 257/119, 120, 122, 146, 162, 173

(56) References Cited

U.S. PATENT DOCUMENTS

| | | | | |
|---|---|---|---|---|
| 5,012,317 A | * | 4/1991 | Rountre | 357/38 |
| 5,182,220 A | * | 1/1993 | Ker et al. | |
| 5,452,171 A | * | 9/1995 | Metz et al. | 361/56 |
| 5,465,189 A | * | 11/1995 | Polgreen et al. | |
| 5,721,445 A | * | 2/1998 | Singh et al. | 257/369 |
| 5,744,840 A | * | 4/1998 | Ng | 257/360 |
| 5,969,400 A | * | 10/1999 | Shinohe et al. | 257/492 |
| 6,061,218 A | * | 5/2000 | Ida et al. | |

FOREIGN PATENT DOCUMENTS

JP           10050936 A   *  2/1998  ........... H01L/27/04

* cited by examiner

Primary Examiner—Nathan Flynn
Assistant Examiner—Kevin Quinto
(74) Attorney, Agent, or Firm—Beyer Weaver & Thomas, LLP

(57) ABSTRACT

A compact SCR structure is provided, having an N-type semiconductor layer, a P-type semiconductor layer in contact with the N-type semiconductor layer, an anode doped region, a cathode doped region, a first contact region and a second contact region. The anode doped region is formed in the N-type semiconductor layer, while the cathode doped region is formed in the P-type semiconductor layer. The first and second contact regions are formed in the N-type semiconductor layer and the P-type semiconductor layer, respectively. According to the present invention, at least one of the anode doped region and the cathode doped region is combined with one of the corresponding first and second contact regions.

2 Claims, 4 Drawing Sheets

SCR COMPACT STRUCTURE

BACKGROUND OF THE INVENTION

1. Field of the Invention

The present invention relates to semiconductor integrated circuit techniques. More particularly, the present invention relates to a compact structure of semiconductor controlled rectifiers.

2. Description of the Related Art

Sub-micron CMOS ICs have become increasingly vulnerable to ESD damage due to advanced processes such as the use of lightly-doped drain structures and clad silicide diffusions. As a solution, lateral semiconductor-controlled rectifiers (LSCRs), disclosed in U.S. Pat. No. 5,012,317, have been employed as ESD protection circuits for shunting ESD stress. The top and cross-sectional views of the conventional LSCR are illustrated in FIGS. 1 and 2, respectively.

Referring to FIGS. 1 and 2, the LSCR is fabricated onto a P-type semiconductor substrate 10, for example a silicon substrate, in a predetermined portion of which an N-well region 11 is formed. In addition, a P-type doped region 12 is formed within the extent of the N-well region 11, and an N-type doped region 13 is formed within the extent of the P-type substrate 10. Therefore, the LSCR is constituted by the P-type doped region 12 as an anode, the N-well region 11 as an anode gate, the P-type substrate 10 as a cathode gate, and the N-type doped region 13 as a cathode.

Moreover, an N-type contact region 14 and a P-type contact region 15 are formed within the N-well region 11 and the P-type substrate 10 as the ohmic contacts, respectively. Usually, the anode 12 and the contact region 14 are tied together to an integrated circuit pad (not shown in the drawing), while the cathode 13 and the contact region 15 are tied together to the $V_{SS}$ power node. The triggering of the conventional LSCR to activate and thus bypass the ESD stress relies heavily on whether the P/N junction between the P-type substrate 10 and the N-well region 11 enters avalanche breakdown.

U.S. Pat. No. 5,465,189 discloses a low voltage triggering SCR (LVTSCR) with a MOS-like device to reduce the trigger voltage within the range of about 10~15V. The top view and cross-sectional view of the conventional LVTSCR are illustrated in FIGS. 3 and 4, respectively.

As shown in FIGS. 3 and 4, the LVTSCR is fabricated onto a P-type semiconductor substrate 30 in which an N-well 31 is provided. In addition, a P-type doped region 32 is formed within the extent of the N-well region 31, and an N-type doped region 33 is formed within the extent of the P-type substrate 30. Therefore, an SCR is constituted by the P-type doped region 32 as an anode, the N-well region 31 as an anode gate, the P-type substrate 30 as a cathode gate, and the N-type doped region 33 as a cathode. Moreover, an N-type doped region 34 is provided with one portion formed in the N-well region 31 and other portion formed in the P-type substrate 30 so as to sit over the P/N junction therebetween. A gate structure 35 is provided to overlie a portion of P-type semiconductor substrate 30 between the N-type doped regions 33 and 34.

Furthermore, an N-type contact region 36 and a P-type contact region 37 are formed within the N-well region 31 and the P-type substrate 30 as the ohmic contacts, respectively. Usually, the anode 32 and the contact region 36 are tied together to an integrated circuit pad (not shown in the drawing), while the cathode 33 and the contact region 37 are tied together to the $V_{SS}$ power node. However, the triggering of the conventional LVTSCR is determined by the P/N junction breakdown between the P-type substrate 30 and the N-type doped region 34 so that the trigger voltage can be reduced within the range of about 10~15V.

As mentioned above, the triggering of the SCR is primarily determined by avalanche breakdown occurring at the junction between the P-type substrate 10 and the N-well region 11 as shown in FIG. 1, or at the junction between the P-type substrate 30 and the N-type doped region 34 as shown in FIG. 3. Therefore, the dimensions for the anode, cathode, and contact region of the SCR are not dominant factors.

SUMMARY OF THE INVENTION

It is therefore an object of the present invention to provide a compact structure of a semiconductor controlled rectifier to reduce the required layout area.

To achieve the above-identified object, the present invention provides an SCR structure having an N-type semiconductor layer, a P-type semiconductor layer in contact with the N-type semiconductor layer, an anode doped region, a cathode doped region, a first contact region and a second contact region. The anode doped region is formed in the N-type semiconductor layer, while the cathode doped region is formed in the P-type semiconductor layer. The first and second contact regions are formed in the N-type semiconductor layer and the P-type semiconductor layer, respectively. According to the present invention, at least one of the anode doped region and the cathode doped region is combined with one of the corresponding first and second contact regions.

Accordingly, because the triggering of the SCR to turn on and thus bypass ESD stress is principally determined by the junction width, the SCR structure of the present invention combines at least one of the anode doped region and the cathode doped region with the corresponding contact region into a common region so as to decrease the required layout area.

Moreover, the present invention provides an SCR structure, which comprises a floating N-type semiconductor layer, a P-type semiconductor layer in contact with the N-type semiconductor layer, an anode doped region, a cathode doped region, and a contact region. The anode doped region is formed in the N-type semiconductor layer, while the cathode doped region and the contact region are formed in the P-type semiconductor layer. According to the present invention, the cathode doped region is combined with the contact region to form a common region.

Accordingly, because the triggering of the SCR to turn on and thus bypass ESD stress is principally determined by the junction width, the SCR structure of the present invention combines the cathode doped region with the contact region into the common region so as to decrease the required layout area.

Furthermore, the present invention provide an SCR structure, which comprises a N-type semiconductor layer, a floating P-type semiconductor layer in contact with the N-type semiconductor layer, an anode doped region, a cathode doped region, and a contact region. The anode doped region and the contact region are formed in the N-type semiconductor layer, while the cathode doped region is formed in the P-type semiconductor layer. According to the present invention, the anode doped region is combined with the contact region to form a common region.

Accordingly, because the triggering of the SCR to turn on and thus bypass ESD stress is principally determined by the junction width, the SCR structure of the present invention combines the anode doped region with the contact region into the common region so as to decrease the required layout area.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

As mentioned above, the triggering of the SCR to turn on and thus bypass ESD stress is mainly determined by the junction width. Consequently, the SCR structure of the present invention combines an anode doped region or a cathode doped region with a corresponding contact region into a common region so as to decrease the required layout area. Several embodiments will be described as follows.

First Embodiment

Figure 1:
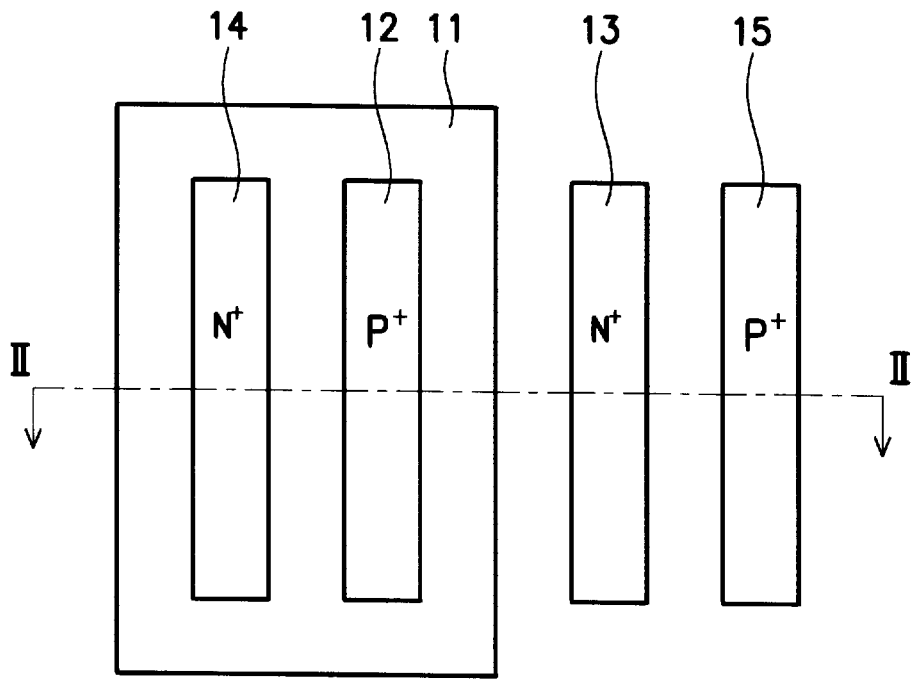
FIG. 1 schematically illustrates a top view of a conventional LSCR structure.
Figure 2:
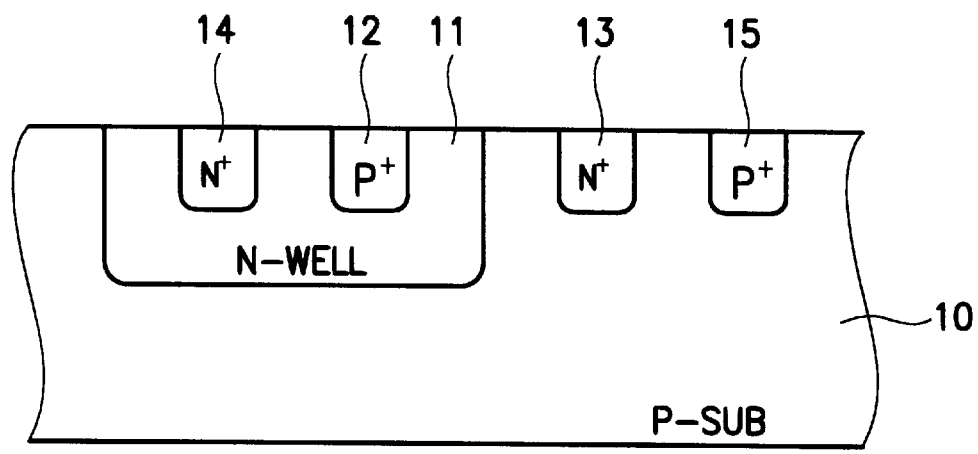
FIG. 2 illustrates a cross-sectional view of FIG. 1, taken along a II—II line.
Figure 5:
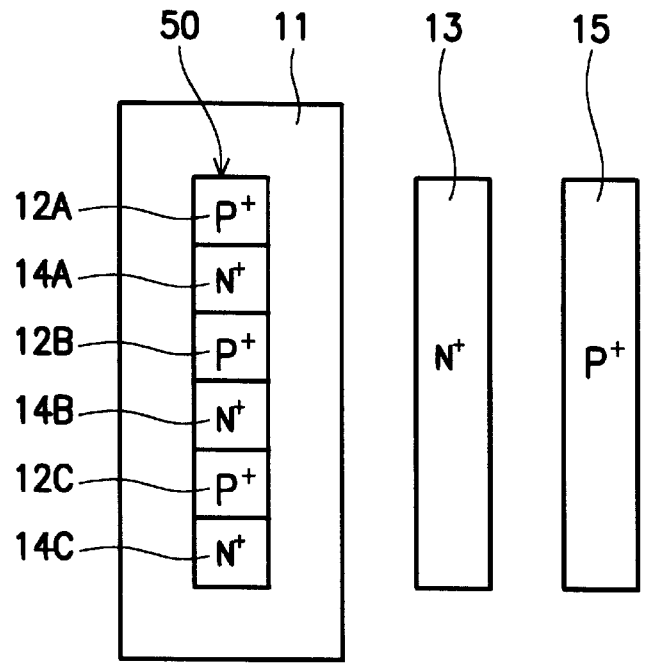
FIG. 5 schematically illustrates a top view of a compact SCR structure in accordance with a first preferred embodiment of the present invention.

Referring to FIG. 5, a compact SCR structure in accordance with a first preferred embodiment of the present invention is schematically illustrated in a top view. In FIG. 5, the anode doped region 12 and the contact region 14 of FIG. 1 are combined, thereby dividing the anode doped region 12 into plural doped blocks 12A~12C and dividing the contact region 14 into plural doped blocks 14A~14C. Preferably, the doped blocks 12A~12C and the doped blocks 14A~14C are alternately arranged and formed in the N-well region 11 to be a common region 50. One common region 50 requires less layout area in contrast with two individual regions 12 and 14 as shown in FIG. 1.

Second Embodiment

Figure 6:
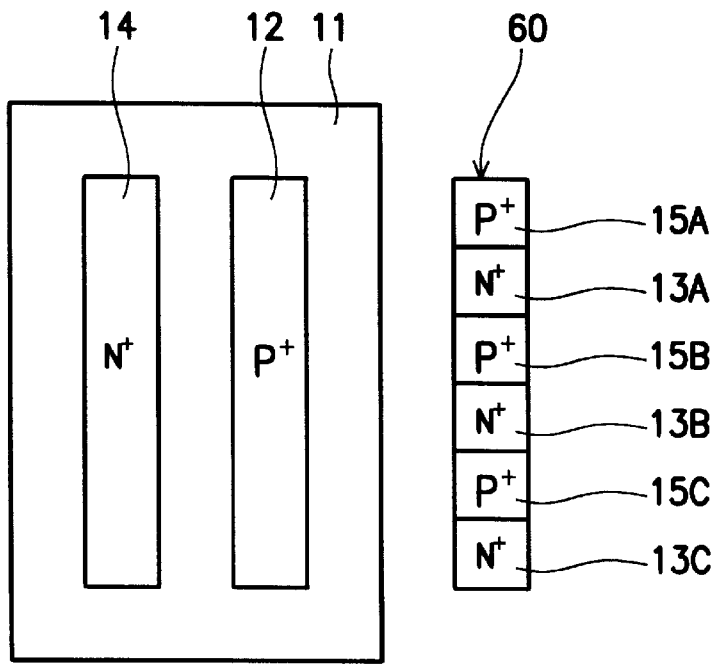
FIG. 6 schematically illustrates a top view of a compact SCR structure in accordance with a second preferred embodiment of the present invention.

Referring to FIG. 6, a compact SCR structure in accordance with a second preferred embodiment of the present invention is schematically illustrated in a top view. In FIG. 6, the cathode doped region 13 and the contact region 15 of FIG. 1 are combined, thereby dividing the cathode doped region 13 into plural doped blocks 13A~13C and dividing the contact region 15 into plural doped blocks 15A~15C. Preferably, the doped blocks 13A~13C and the doped blocks 15A~15C are alternately arranged and formed in the P-type semiconductor substrate 10 to be a common region 60. One common region 60 requires less layout area in contrast with two individual regions 13 and 15 as shown in FIG. 1.

Third Embodiment

Figure 3:
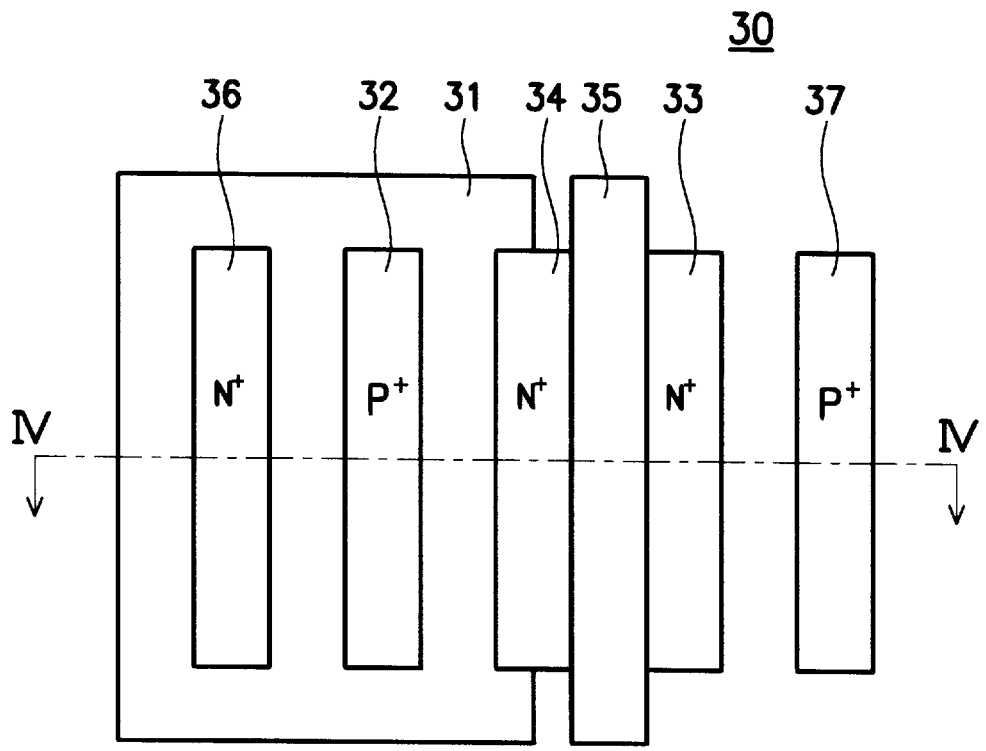
FIG. 3 schematically illustrates a top view of a conventional LVTSCR structure.
Figure 4:
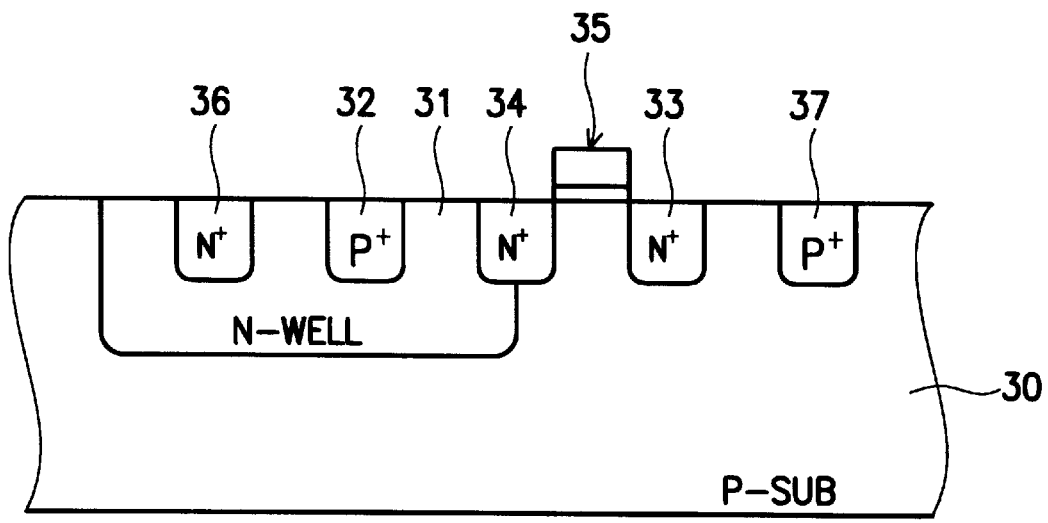
FIG. 4 illustrates a cross-sectional view of FIG. 3, taken along a IV—IV line.
Figure 7:
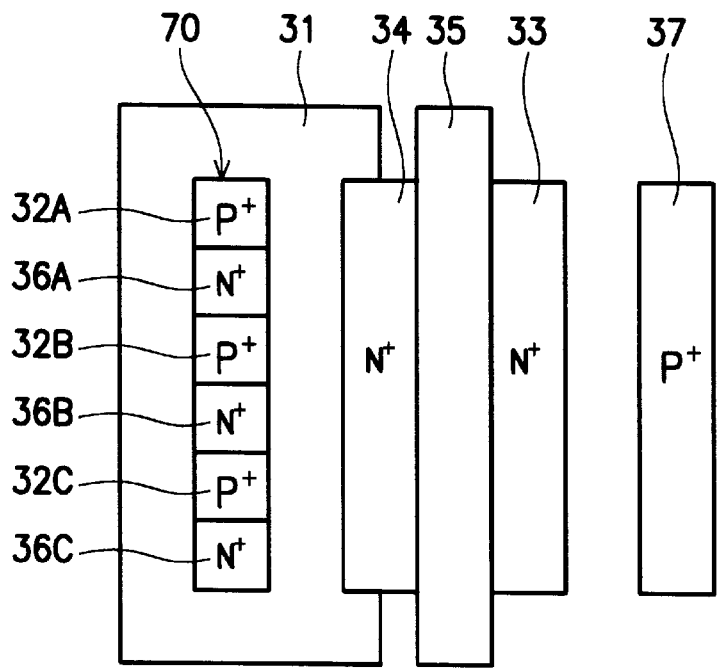
FIG. 7 schematically illustrates a top view of a compact SCR structure in accordance with a third preferred embodiment of the present invention.

Referring to FIG. 7, a compact SCR structure in accordance with a third preferred embodiment of the present invention is schematically illustrated in a top view. In FIG. 7, the anode doped region 32 and the contact region 36 of FIG. 3 are combined, thereby dividing the anode doped region 32 into plural doped blocks 32A~32C and dividing the contact region 36 into plural doped blocks 36A~36C. Preferably, the doped blocks 32A~32C and the doped blocks 36A~36C are alternately arranged and formed in the N-well region 31 to be a common region 70. One common region 70 requires less layout area in contrast with two individual regions 32 and 36 as shown in FIG. 3.

Fourth Embodiment

Figure 8:
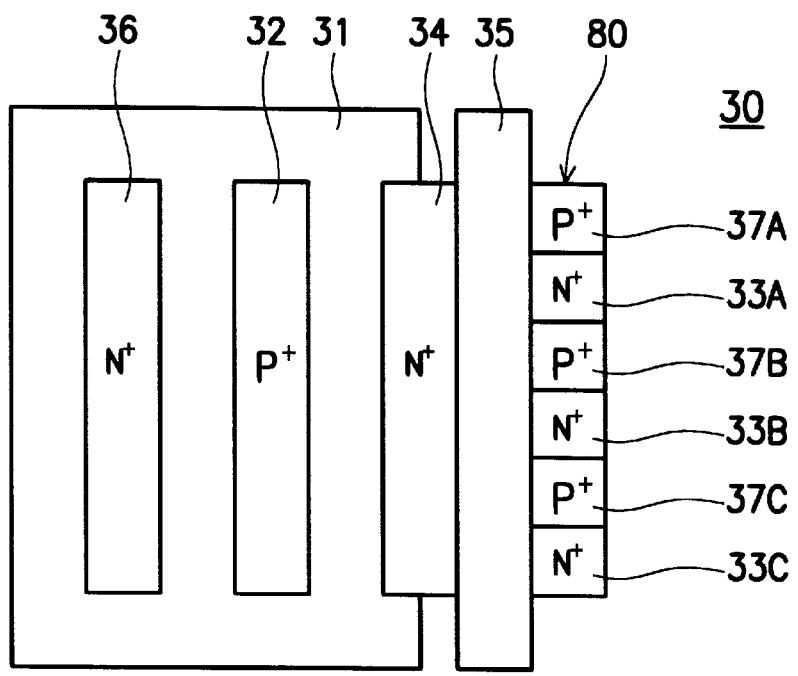
FIG. 8 schematically illustrates a top view of a compact SCR structure in accordance with a fourth preferred embodiment of the present invention.

Referring to FIG. 8, a compact SCR structure in accordance with a fourth preferred embodiment of the present invention is schematically illustrated in a top view. In FIG. 8, the cathode doped region 33 and the contact region 37 of FIG. 3 are combined, thereby dividing the cathode doped region 33 into plural doped blocks 33A~33C and dividing the contact region 15 into plural doped blocks 37A~37C. Preferably, the doped blocks 33A~33C and the doped blocks 37A~37C are alternately arranged and formed in the P-type semiconductor substrate 30 to be a common region 80. One common region 80 requires less layout area in contrast with two individual regions 33 and 37 as shown in FIG. 3.

Fifth Embodiment

The first and second embodiments can be applied concurrently. Therefore, the required layout area for the SCR can be further reduced by replacing the anode doped region 12 and the contact region 14 of FIG. 1 with the common region 50, and replacing the cathode doped region 13 and the contact region 15 of FIG. 1 with the common region 60.

Sixth Embodiment

The third and fourth embodiments can be applied concurrently. Therefore, the required layout area for the SCR can be further reduced by replacing the anode doped region 32 and the contact region 36 of FIG. 3 with the common region 70, and replacing the cathode doped region 33 and the contact region 37 of FIG. 3 with the common region 80.

Seventh Embodiment

When the N-well region 11 of FIG. 1 is floating, that is, when no contact region 14 is provided, the cathode doped region 13 can be divided into the doped blocks 13A~13C and the contact region 15 into the doped blocks 15A~15C as in the second embodiment. Preferably, the doped blocks 13A~13C and the doped blocks 15A~15C are alternately arranged and formed in the P-type semiconductor substrate 10 to be the common region 60. One common region 60 requires less layout area in contrast with two individual regions 13 and 15 as shown in FIG. 1.

Eighth Embodiment

When the N-well region 31 of FIG. 3 is floating, that is, when no contact region 36 is provided, the cathode doped region 33 can be divided into the doped blocks 33A~33C and the contact region 37 into the doped blocks 37A~37C as in the fourth embodiment. Preferably, the doped blocks 33A~33C and the doped blocks 37A~37C are alternately arranged and formed in the P-type semiconductor substrate 30 to be the common region 80. One common region 80 requires less layout area in contrast with two individual regions 33 and 37 as shown in FIG. 3.

Ninth Embodiment

When the P-type semiconductor substrate 10 of FIG. 1 is floating, that is, when no contact region 15 is provided, the anode doped region 12 can be divided into the doped blocks 12A~12C and the contact region 14 into the doped blocks 14A~14C as in the first embodiment. Preferably, the doped blocks 12A~12C and the doped blocks 14A~14C are alternately arranged and formed in the N-well region 11 to be the common region 50. One common region 50 requires less layout area in contrast with two individual regions 12 and 14 as shown in FIG. 1.

Tenth Embodiment

When the P-type semiconductor substrate 30 of FIG. 3 is floating, that is, when no contact region 37 is provided, the anode doped region 32 can be divided into the doped blocks 32A~32C and the contact region 36 into the doped blocks 36A~36C as in the third embodiment. Preferably, the doped blocks 32A~32C and the doped blocks 36A~36C are alternately arranged and formed. in the N-well region 31 to be the common region 70. One common region 70 requires less layout area in contrast with two individual regions 32 and 36 as shown in FIG. 3.

In conclusion, because the triggering of the SCR to turn on and thus bypass ESD stress is principally determined by the junction width, the SCR structure of the present invention combines at least one of the anode doped region and the cathode doped region with the corresponding contact region into a common region so as to decrease the required layout area.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An SCR structure, comprising:
   a N-type semiconductor layer;
   a P-type semiconductor layer in contact with said N-type semiconductor layer;
   a plurality of anode blocks formed in said N-type semiconductor layer;
   a cathode doped region formed in said P-type semiconductor layer;
   a plurality of contact blocks corresponding to said plurality of anode blocks formed in said N-type semiconductor layer; and
   a second contact region corresponding to said cathode doped region formed in said P-type semiconductor layer;
   wherein said plurality of anode blocks are combined with said corresponding plurality of contact blocks to form a common region, and the arrangement of said plurality of anode blocks and said corresponding plurality of contact blocks is perpendicular to the arrangement of said cathode doped region and said corresponding second contact region.

2. The SCR structure as claimed in claim 1, wherein said anode blocks and said contact blocks are arranged alternatively.

* * * * *